United States Patent
Marsh

(10) Patent No.: US 6,204,172 B1
(45) Date of Patent: Mar. 20, 2001

(54) LOW TEMPERATURE DEPOSITION OF BARRIER LAYERS

(75) Inventor: Eugene P. Marsh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/146,300

(22) Filed: Sep. 3, 1998

(51) Int. Cl.[7] .................................................. H01L 21/44
(52) U.S. Cl. .................... 438/653; 438/600; 438/458; 427/60; 257/295
(58) Field of Search .................... 438/653, 600, 438/458; 257/295; 437/60

(56) References Cited

U.S. PATENT DOCUMENTS

| | | | |
|---|---|---|---|
| 5,045,899 | * 9/1991 | Arimoto | 357/23.6 |
| 5,270,241 | 12/1993 | Dennison et al. | |
| 5,392,189 | 2/1995 | Fazan et al. | |
| 5,466,629 | * 11/1995 | Mihara et al. | 437/60 |
| 5,555,486 | 9/1996 | Kingon et al. | |
| 5,561,307 | 10/1996 | Mihara et al. | |
| 5,566,045 | 10/1996 | Summerfelt et al. | |
| 5,581,436 | 12/1996 | Summerfelt et al. | |
| 5,599,424 | 2/1997 | Matsumoto et al. | |
| 5,637,527 | 6/1997 | Baek. | |
| 5,639,698 | 6/1997 | Yamazaki et al. | |
| 5,652,171 | 7/1997 | Nagano et al. | |
| 5,679,980 | 10/1997 | Summerfelt. | |
| 5,695,815 | 12/1997 | Vaartstra | 427/226 |
| 6,063,705 | 5/2000 | Vaartstra | 438/681 |

OTHER PUBLICATIONS

Bhatt et al., "Novel high temperature multilayer electrode–barrier structure for high–density ferroelectric memories," *Appl. Phys. Letter.*, 71 (1997).

Kwon et al., "Characterization of Pt Thin Films Deposited by Metalorganic Vapor Deposition for Ferroelectric Bottom Electrodes," *J. Electrochem. Soc.*, 144, 2848–2854 (1997).

* cited by examiner

*Primary Examiner*—Richard Elms
*Assistant Examiner*—Pho Luy
(74) *Attorney, Agent, or Firm*—Mueting, Raasch & Gebhardt, P.A.

(57) ABSTRACT

The present invention provides a method for forming a barrier layer, preferably a conductive barrier layer. According to the present invention, a barrier layer is formed from an organometallic precursor in the presence of an oxidant in a low temperature deposition technique using a platinum containing precursor. Such layers are particularly advantageous for use in memory devices, such as dynamic random access memory (DRAM) devices.

30 Claims, 4 Drawing Sheets

LOW TEMPERATURE DEPOSITION OF BARRIER LAYERS

FIELD OF THE INVENTION

This invention relates to the preparation of semiconductor device structures. Particularly, the present invention pertains to forming diffusion barrier layers using an organometallic precursor in a low temperature deposition method.

BACKGROUND OF THE INVENTION

In the fabrication of integrated circuits, various conductive layers are used. For example, during the formation of semiconductor devices, such as dynamic random access memories (DRAMs), static random access memories (SRAMs), ferroelectric (FE) memories, etc., conductive materials are used in the formation of storage cell capacitors and also may be used in interconnection structures, e.g., conductive layers in contact holes, vias, etc. In many applications, it is preferable that the material used provide effective diffusion barrier characteristics. For example, diffusion barriers are commonly used to prevent undesirable reactions in contact openings.

Further, for example, effective diffusion barrier characteristics are required for conductive materials used in the formation of storage cell capacitors of memory devices, e.g., DRAMs. As memory devices become more dense, it is necessary to decrease the size of circuit components forming such devices. One way to retain storage capacity of storage cell capacitors of the memory devices and at the same time decrease the memory device size is to increase the dielectric constant of the dielectric layer of the storage cell capacitor. Therefore, high dielectric constant materials are used in such applications interposed between two electrodes. One or more layers of various conductive materials may be used as the electrode material. However, generally, one or more of the layers of the conductive materials used for the electrodes (particularly the lower electrode of a cell capacitor) must have cerain barrier properties and oxidation resistance properties. Such properties are particularly required when high dielectric constant materials are used for the dielectric layer of the storage cell capacitor because of the processes used for forming such high dielectric materials, e.g., deposition of high dielectric materials usually occurs at high temperatures (generally greater than about 500° C.) in an oxygen-containing atmosphere.

Generally, various metals and metallic compounds, and typically notable metals such as platinum and conductive oxides such as ruthenium oxide, have been proposed as the electrodes or at least one of the layers of the electrodes for use with high dielectric constant materials. However, reliable electrical connections should generally be constructed which do not diminish the beneficial properties of the high dielectric constant materials. For platinum to function well as a bottom electrode, it must be an effective barrier to the diffusion of oxygen. This is required since any oxidation of underlying silicon upon which the capacitor is formed will result in a decreased series capacitance, thus degrading the storage capacity of the cell capacitor. Platinum, used alone as an electrode layer, is too permeable to oxygen to be used as a bottom electrode of a storage cell capacitor. For example, there should also be a silicon barrier so that silicon does not diffuse through the platinum to form $SiO_2$ at the platinum surface.

Because of the permeability of platinum to oxygen, typically platinum is used as a layer in an electrode stack which acts as the electrode as well as a diffusion barrier for integration of capacitors directly formed on silicon. For example, as described in the article "Novel High Temperature Multilayer Electrode-Barrier Structure for High Density Ferroelectric Memories" by H. D. Bhatt, et al., *Appl. Phys.Letter*, 71(5), Aug. 4, 1997, the electrode barrier structure includes layers of platinum:rhodium alloy, in addition to platinum:rhodium oxide layers, to form electrodes with diffusion barrier properties. Such alloy layers are formed using physical vapor deposition (PVD) processing, e.g., reactive RF sputtering processes. Additionally, the formation of a platinum film was described by Kwon et al., wherein the deposition was accomplished by metallorganic chemical vapor deposition from hydrocarbon precursors in an oxygen atmosphere in the temperature range of 300° C. to 450° C. for various deposition times. "Characterization of Pt Thin Films Deposited by Metallorganic Vapor Deposition for Ferroelectric Bottom Electrodes," J. H. Kwon et al., *J. Electrochem. Soc.*, Vol. 144, No. 8, pp. 2848–2854 (1997).

Many storage cell capacitors are formed using high aspect ratio openings. For example, in U.S. Pat. No. 5,392,189 to Fazan, et al., entitled "Capacitor Compatible with High Dielectric Constant Materials Having Two Independent Insulative Layers and the Method for Forming Same," issued Feb. 21, 1995, the storage cell capacitors include a lower electrode that is formed by deposition of a conductive material within a small high aspect ratio opening. Typically, sputtering does not provide a sufficiently conformal layer adequate for formation of an electrode within such a small high aspect ratio opening.

Chemical vapor deposition (hereinafter "CVD") is one process of forming relatively thin layers on semiconductor wafers, such as layers of elemental metals or compounds. It is a favored layer formation process primarily because of its ability to provide highly conformal layers even within deep contacts and other openings. CVD is defined as the formation of a non-volatile solid layer or film on a substrate by the reaction of vapor phase reactants that contain desired components. The vapors are introduced into a reactor vessel or chamber, and decompose and/or react at a heated surface on a wafer to form the desired layer.

For example, a compound, typically a heat decomposable volatile compound (also known as a precursor), is delivered to a substrate surface in the vapor phase. The precursor is contacted with a surface which has been heated to a temperature above the decomposition temperature of the precursor. A coating or layer forms on the surface. The layer generally contains a metal, metalloid, alloy, or mixtures thereof, depending upon the type of precursor and deposition conditions employed.

Precursors typically utilized in CVD of conductive layers are generally organometallic compounds, wherein a hydrocarbon portion of the precursor functions as the carrier for the metal or metalloid portion of the precursor during vaporization of the liquid precursor. For microelectronic applications, it is often desirable to deposit layers having high conductivity. This generally means that the layers should contain minimal contaminants, such a oxygen, carbon, and the like. In addition to the formation of capacitor electrodes, the formation of barrier layers for use in other applications, e.g., interconnect applications, is also desirable. For example, diffusion barriers are commonly used to prevent undesirable reactions in contact openings.

SUMMARY OF THE INVENTION

Thus, what is further needed are methods for forming effective barrier layers in a semiconductor structure so that the resulting barrier layer can block migration of oxygen and/or silicon. Such barrier layers would be useful for semiconductor structures, e.g., an electrode of a capacitor, contacts, etc., that can be used in microelectronic devices, such as memory devices. For example, to overcome the problems described above with respect to the use of platinum alone as a barrier material, and others which will be apparent from the detailed description below, a method for forming a platinum diffusion barrier layer, methods of forming structures incorporating such layers, e.g., the use of a single platinum layer as a capacitor electrode having effective diffusion properties, and other methods associated therewith are described herein.

Preferably, a method according to the present invention includes forming a barrier layer from an organometallic precursor in a low temperature deposition technique, preferably in the presence of an oxidant.

As used herein, "low temperature" refers to the surface temperature of the substrate at which deposition occurs, preferably less than about 350° C., more preferably about 300° C. or less, and even more preferably, about 100° C. to about 300° C.

As used herein, "oxidant" refers to a compound that causes oxidation of the organic portion of the organometallic precursor, defined herein. Preferably, an oxidant is selected from the group consisting of oxygen, ozone, $N_2O$, NO, $SO_3$, $H_2O_2$, $R_2O_2$, and a combination thereof, wherein R is selected from the group consisting of a saturated or unsaturated linear, branched or cyclic hydrocarbon group having about 1 carbon atom to about 20 carbon atoms, preferably about 2 carbon atoms to about 12 carbon atoms, for example, methyl, ethyl, isopropyl, t-butyl, heptyl, dodecyl, octadecyl, amyl, 2-ethylhexyl, and the like.

As used herein, "substrate assembly" refers to either a semiconductor substrate such as the base semiconductor layer, e.g., the lowest layer of a silicon material on a wafer, or a silicon layer deposited on another material, such as silicon on sapphire, or a semiconductor substrate having one or more layers or structures formed thereon or regions formed therein. When reference is made to a "substrate assembly" in the following description, various process steps may have been previously used to form or define regions, junctions, various structures or features, and openings such as vias, contact openings, high aspect ratio openings, etc. For example, as used herein, substrate assembly may refer to a structure upon which a lower electrode of a capacitor structure is formed.

One aspect of the present invention provides a method for use in fabrication of integrated circuits. Preferably, the method includes providing a substrate assembly having a surface; and forming a barrier layer from an organometallic precursor in the presence of an oxidant at a temperature of about 300° C. or less.

Another aspect of the present invention provides a method for use in formation of a capacitor on a substrate. Preferably, the method includes providing a surface of a substrate assembly; forming a first electrode on at least a portion of the surface of the substrate assembly from a platinum-containing organometallic precursor in the presence of an oxidant at a temperature less than about 350° C., wherein the first electrode substantially inhibits permeation of oxygen and silicon therethrough; forming a high dielectric material over at least a portion of the first electrode; and forming a second electrode on at least a portion of the high dielectric material.

In accordance with the present invention, a metal portion of the organometallic precursor is preferably platinum.

Additionally, forming a barrier layer in accordance with the present invention is preferably carried out at a temperature of about 100° C. to about 300° C. Forming a barrier layer preferably utilizes a pressure of about 0.1 torr to about 100 torr. Further, the organometallic precursor preferably has a flow rate of about 1 sccm to about 1000 sccm and the oxidant has a flow rate of about 1 sccm to about 5000 sccm.

A further aspect of the present invention provides a method of forming an electrode of a capacitor including providing a surface of a substrate assembly; and forming at least one conductive layer on at least a portion of the surface of the substrate assembly, wherein the at least one conductive layer of the electrode is formed from a platinum containing precursor in the presence of an oxidant at a temperature of about 100° C. to about 300° C.

Yet another aspect of the present invention provides a method for forming a conductive barrier layer including providing a substrate including a heated surface in a reactor chamber, wherein the heated surface is about 300° C. or less; providing an oxidant within the reactor chamber, wherein the organometallic catalyst comprises a platinum metallic portion; and supplying a organometallic precursor to the reactor chamber; wherein the conductive barrier layer forms on the heated surface.

In accordance with the present invention, the surface preferably includes a material selected from the group of silicon, silicone dioxide, BPSG, PSG, TiN, Ti, W, Rh, Ru, Ir, $RhO_2$, $RuO_2$, $IrO_2$, and a combination thereof.

Preferably, the organometallic precursor is a platinum containing precursor selected from the group of Me(cyclopentadienyl)Pt(Me)$_3$, Pt(PF$_3$)$_4$, Pt(CO)$_2$Cl$_2$, Pt(CH$_3$)$_2$[(CH$_3$)NC], (1,5 cyclooctadiene)Pt(CH$_3$)$_2$, (COD)Pt (CH$_3$)Cl, (C$_5$H$_5$)Pt(CH$_3$)(CO), (acetylacetonate)(Pt)(CH$_3$)$_3$, and a combination thereof. Further, the oxidant utilized in accordance with the present invention is selected from the group consisting of oxygen, ozone, $N_2O$, NO, $SO_3$, $H_2O_2$, $R_2O_2$, and a combination thereof, wherein R is selected from the group consisting of a saturated or unsaturated linear, branched or cyclic hydrocarbon group having about 1 carbon atom to about 20 carbon atoms.

These and other objects, features and advantages of the present invention will be apparent from the following description of various embodiments and as illustrated in the accompanying figures.

DETAILED DESCRIPTION OF PREFERRED EMBODIMENTS

Figure 1:
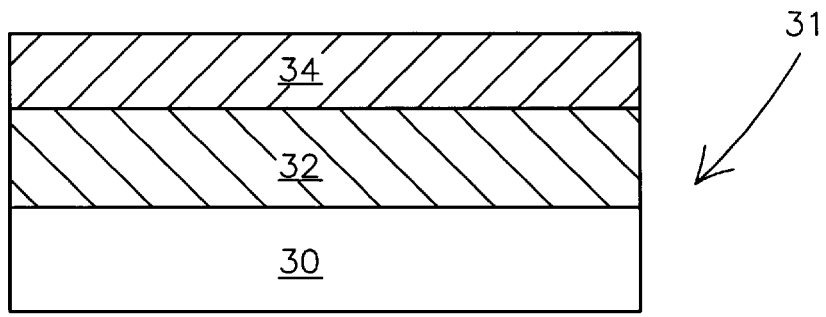
FIG. 1 is a cross-sectional schematic of one embodiment of a structure including a layer formed in accordance with the present invention.

The present invention provides a method for forming a barrier layer from an organometallic precursor in a low temperature deposition technique. Preferably, the method includes forming the barrier layer in the presence of an oxidant. The resultant barrier layer is preferably a platinum-containing layer. The layer can be deposited in a wide variety of thicknesses, depending upon the desired use. Advantageously, the barrier layer is a conductive layer that can be used in memory devices, such as DRAM devices, as an electrode layer, a via, a contact, or any other interconnection structure.

A. Layer Formation Method

The present invention broadly relates to the formation of a barrier layer. In the present invention, one preferred system for forming a layer is chemical vapor deposition (CVD). CVD is generally a process in which a layer is deposited by a chemical reaction or decomposition of a gas mixture at elevated temperature at a substrate assembly surface or in its vicinity. CVD can be classified into various types in accordance with the heating method, gas pressure, and/or chemical reaction. For example, conventional CVD methods include: (a) cold wall type CVD, in which only a deposition substrate is heated; (b) hot wall type CVD, in which an entire reaction chamber is heated; (c) atmospheric CVD, in which reaction occurs at a pressure of about one atmosphere; (d) low-pressure CVD in which reaction occurs at pressures from about $10^{-1}$ to 100 torr; (e) electron-beam assisted CVD and ion-beam assisted CVD in which the energy from an electron-beam or an ion-beam directed towards the substrate provides the energy for decomposition of the precursor; (f) plasma assisted CVD and photo-assisted CVD in which the energy from a plasma or a light source activates the precursor to allow depositions at reduced substrate temperatures; and (g) laser assisted CVD wherein laser light is used to heat the substrate or to effect photolytic reactions in the precursor gas. In the cold wall type CVD, heating of substrates in a CVD reactor may be accomplished by several methods including the use of hot stages or induction heating.

In a typical CVD process, a substrate assembly on which deposition is to occur is placed in a reaction chamber, and is heated to a temperature sufficient to cause the decomposition of vapors of the precursor, as described below. When these vapors are introduced into the reaction chamber and transported to the vicinity of the surface, they will decompose thereon to deposit a layer containing a metal or metalloid. Typically, CVD can be used to provide blanket deposition of metal or metalloid layers on surfaces, as well as to provide deposition of these materials on selected areas of the substrate, e.g., by use of a masking material, such as a resist material.

Any CVD apparatus design may be used in the present invention including hot wall reactors, cold wall reactors, radiation beam assisted reactors, plasma assisted reactors, and the like. For blanket depositions, a cold wall-hot substrate reactor may sometimes be preferred as this design is efficient in regards to precursor consumption. For example, the CVD processes described herein may be carried out in a chemical vapor deposition reactor, such as a reaction chamber available under the trade designation of 7000 from Genus, Inc. (Sunnyvale, Calif.), a reaction chamber available under the trade designation of 5000 from Applied Materials, Inc. (Santa Clara, Calif.), or a reaction chamber available under the trade designation of Prism from Novelus, Inc. (San Jose, Calif.). However, any reaction chamber suitable for performing CVD may be used.

In the present invention, a method for forming a barrier layer from an organometallic precursor is preferably conducted using a CVD process using a low temperature deposition technique. Preferably the method is carried out in the presence of an oxidant. Generally, the metal containing precursor, i.e., the organometallic precursor, may be a liquid or a solid at room temperature. Typically, however, such precursors are liquids. If they are solids, they are preferably sufficiently soluble in an organic solvent or have melting points below their decomposition temperature such that they can be used in flash vaporization, bubbling, microdroplet formation techniques, etc. However, they may also be sufficiently volatile that they can be vaporized or sublimed from the solid state using known chemical vapor deposition techniques. Thus, the precursor composition of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material. Preferably, however, there is a sufficient amount of the material that can be carried by the organic solvent into the vapor phase for chemical vapor deposition processing.

If the metal precursor is a liquid, it may be delivered through use of bubbling techniques. Generally, the liquid precursor is contained in a bubbler reservoir through which a carrier gas, such as helium or any other inert gas, i.e., a gas that is nonreactive with other gases in the process (e.g., nitrogen, argon, neon, and xenon) is passed. In other words, the carrier gas is bubbled through the reservoir containing the precursor to deliver the precursor to the reaction chamber. If a carrier gas is used, it is preferably supplied to the reaction chamber at a rate up to about 500 sccm.

Generally, the reaction chamber and the substrate assembly surface upon which deposition is to occur are maintained at a preselected temperature, by means of an external furnace or an internal heater chuck. In conventional CVD processes, the preselected temperature is generally effective to decompose the precursor vapor so as to deposit a layer on the exposed surfaces of the substrate assembly. In a conventional reaction chamber for depositing a conductive layer, e.g., platinum, the temperature is maintained between about 350° C.–700° C. However, in a method in accordance with the present invention, the substrate assembly surface, e.g., wafer surface, is maintained at a temperature less than about 350° C., more preferably, about 300° C. or less, and even more preferably about 100° C. to about 300° C., during the deposition process.

Generally, vacuum systems are used for CVD of the metals. There is a wide range of operation conditions with respect to the pressure in the system. Operating pressures of 1 to 100 mtorr have been used in the absence of carrier gas and higher or lower pressures are also acceptable, i.e., up to about 10 torr. These pressures are largely determined by the pumping speed of the vacuum equipment, the chamber volume, and the vapor pressure of the precursor.

Preferably, the deposition of the barrier layer, e.g., platinum, is preferred in the presence of an oxidant added to the reaction chamber in accordance with the present invention. The oxidant is typically in the form of a gas. More preferably, the oxidant is an oxygen-containing gas selected from the group consisting of air, oxygen, ozone, $N_2O$, NO, $SO_3$, $H_2O_2$, $R_2O_2$, and a combination thereof, wherein R is selected from the group consisting of a saturated unsaturated linear, branched or cyclic hydrocarbon group having about 1 carbon atom to about 20 carbon atoms, preferably about 2 carbon atoms to about 12 carbon atoms, for example, methyl, ethyl, isopropyl, t-butyl, heptyl, dodecyl, octadecyl, amyl, 2-ethylhexyl, and the like. While not intending to be bound by any particular theory, it is believed that the oxidant facilitates the oxidation of the organic portion of the organometallic precursor to produce volatile by-products and thus prevent incorporation of carbon into the resulting layer. Preferably, the oxidant is provided to the reaction chamber at a rate of about 1 sccm to about 5000 sccm, more preferably about 5 sccm to about 2000 sccm, and even more preferably about 50 sccm to about 500 sccm.

A diluent gas may also be provided to the reaction chamber. For example, the diluent gas may be an inert gas such as helium, argon, nitrogen, neon, krypton, xenon, and mixtures thereof.

Prior to initiating CVD, the substrate assembly, such as wafers upon which a layer is to be deposited, are pre-cleaned by the standard means of sequential soaking in baths such as tetrachloroethane, methanol, distilled water, dilute hydrofluoric acid, and distilled water, for example. After cleaning, the wafers are placed in the reaction chamber at the required deposition temperature so that the organometallic precursor vaporizes and the wafer surface is exposed to the vapors of for a time sufficient to produce a layer, typically about 1 minute or less, that has effective barrier properties.

Generally, a barrier layer so formed preferably has a thickness of about 100 angstroms to about 800 angstroms, more preferably about 200 angstroms to about 500 angstroms, wherein the thickness of the layers may be altered by the time of exposure to the vapors.

After deposition and annealing, substrates can be analyzed using a conventional surface analytical technique such as by x-ray photo electron spectroscopy (XPS) or Auger electron spectroscopy (AES) methods to generate a depth profile. As discussed in the Examples below, an effective barrier layer can be formed in accordance with the present invention, wherein silicon from the substrate assembly beneath the barrier layer did not diffuse through the barrier layer and oxygen levels during an anneal in an oxygen atmosphere did not diffuse through the barrier layer. In addition to being an effective barrier layer, the barrier layer formed in accordance with the present invention can also function where high dielectric materials are particularly desirable, such as a bottom electrode in a capacitor device.

B. Organometallic Precursor

As discussed above, layer formation in accordance with the present invention is preferably accomplished using an organometallic precursor. "Organometallic precursor," as used herein, means a mononuclear (i.e., monomer) compound having an organic portion and a metallic portion. Various combinations of compounds described herein can be used in the precursor for chemical vapor deposition. Thus, as used herein, a "precursor" refers to a liquid or solid that includes one or more compounds of the type described herein. The precursor can also include one or more organic solvents suitable for use in chemical vapor deposition, as well as other additives.

As used herein, "organic portion" means a hydrocarbon group that is classified as an aliphatic group, cyclic group, or a combination of aliphatic and cyclic groups (e.g., alkaryl and aralkyl groups). In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group, including, for example, methyl, ethyl, isopropyl, t-butyl, heptyl, dodecyl, octadecyl, amyl, 2-ethylhexyl, and the like. The term "alkenyl group" means an unsaturated linear or branched hydrocarbon group with one or more carbon-carbon double bonds, such as a vinyl group. The term "alkynyl group" means an unsaturated linear or branched hydrocarbon group with one or more triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

The term "group" is used to describe a chemical substituent that includes the unsubstituted group and the group with nonperoxidic O, N, or S atoms, for example, in the chain as well as carbonyl groups or other conventional substitution. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxylalkyls, hydroxylalkyls, sulfoalkyls, etc.

The metal portion of the organometallic precursor is preferably platinum. Thus, the organometallic precursor is a platinum containing precursor that can be selected from the group consisting of $MeCpPt(Me)_3$ (where Cp=cyclopentadienyl), $Pt(PF_3)_4$, $Pt(CO)_2Cl_2$, $Pt(CH_3)_2[(CH_3)CN]$, $(COD)Pt(CH_3)_2$, $(COD)Pt(CH_3)Cl$, $(C_5H_5)Pt(CH_3)(CO)$, $(acac)(Pt)(CH_3)_3$, wherein COD=1,5 cyclooctadiene and acac=acetylacetonate.

C. Substrate Assemblies

Any type of substrate can be used, including metals, graphite, semiconductors, insulators, ceramics and the like as long as the substrate is not substantially deteriorated under the deposition conditions. Such substrates include, but are not limited to, silicon, tin oxide, gallium arsenide (GaAs), silica, glass, alumina, zirconia, as well as polyimide, polymethylmethacrylate, polystryene, parylene, and other synthetic polymers.

Although the exemplified substrate surfaces are planar, the present process can provide conformal deposition so that the material can be deposited as continuous layers into recesses, trenches, and vias, and over stepped surfaces, such as those which are topologically microstructured including those that may have relatively high aspect ratios. The substrate can be of any desired shape, either regular or irregular. Thus, the substrate can be a rectangular solid or other solid characterized by flat exterior surfaces. For example, such substrate assemblies upon which the layer is deposited may be surfaces for use in formation of capacitors such as planar cells, trench cells (e.g., double sidewall trench capacitors), stacked cells (e.g., crown, V-cell, delta cell, multi-fingered, or cylindrical container stacked capacitors), as well as field effect transistor devices. The substrate assembly could also include rough surfaces, such as hemispherical grain polysilicon.

Referring to FIG. 1, structure 31 includes a barrier layer 32 deposited on a substrate assembly 30, such as a structure upon which a capacitor is to be formed, an opening for a contact, etc. The layer 32, deposited in accordance with the present invention as described above, includes a metal from the metal portion of the organometallic precursor used. Preferably, the barrier layer 32 has a thickness of about 100 angstroms to about 800 angstroms.

One or more other layers can then be deposited on the barrier layer 32. For example, the region 34 may be a conductive material that contains a metal or metalloid material formed from a precursor so as to form another layer of an electrode of a capacitor, e.g., a conductive layer can be selected from the group consisting essentially of titanium, tantalum, ruthenium, osmium, iron, rhodium, cobalt, nickel, iridium, cerium, tungsten, aluminum, copper, and a combination thereof. These materials may also be the nitride or oxide form thereof.

Further, region 34 may be representative of a high dielectric material for a high dielectric capacitor formed directly over a single layer of platinum deposited according to the present invention. The single layer of platinum deposited at a low temperature surprisingly has effective barrier properties such that it can be used alone as the lower electrode of a high dielectric capacitor. Yet further, region 34 may be a contact material formed after a diffusion barrier layer 32, lining an opening. As one skilled in the art will recognize, region 34 may be any desired material or materials depending on the application for which diffusion barrier layer 32 is useful.

Figure 2:
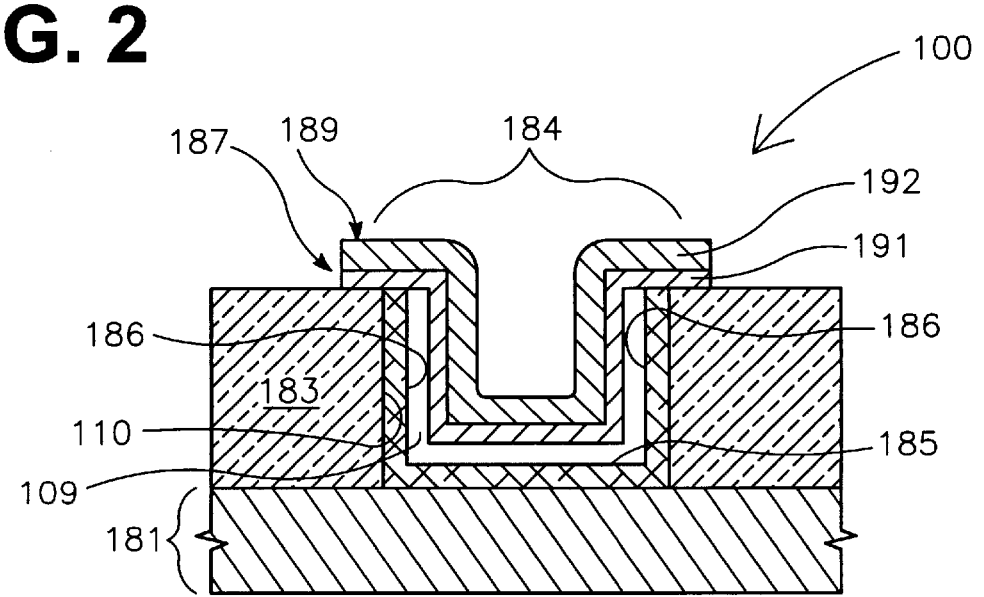
FIG. 2 is a cross-sectional schematic of an embodiment of a capacitor including a layer formed in accordance with the present invention.

Referring to FIG. 2, a bottom electrode of a high dielectric capacitor of a storage cell is shown that includes one or more diffusion barrier layers as described herein. Further, the use of diffusion barrier layers according to the present invention is described with reference to FIG. 3 wherein a contact liner requiring diffusion barrier characteristics is described.

As shown in FIG. 2, a device structure 100 is fabricated in accordance with conventional processing techniques through the formation of an opening 184 prior to depositing a bottom electrode structure 187 on the surface 185, e.g., a silicon containing surface, and surface 186 defining the opening 184. A bottom electrode stack 187 including a diffusion barrier layer, e.g., a platinum diffusion barrier layer, and one or more other conductive layers is formed in opening 184 according to the present invention as previously described herein. The substrate assembly 181 may include various elements, such as field oxide regions, active regions, i.e., those regions of a silicon substrate not covered by field oxide, word lines, field effect transistors (FET), source/drain regions created in the silicon substrate, etc. An insulative layer of oxide material 183 is formed over the substrate assembly. The opening 184 in the insulative layer 183 is a small high aspect ratio opening. As described herein, small high aspect ratio openings have feature sizes or critical dimensions below about 1 micron (e.g., such as a diameter or width of an opening being less than about 1 micron) and aspect ratios greater than about 1. Such aspect ratios are applicable to contact holes, vias, trenches, and any other configured openings. For example, a trench having an opening of 1 micron and depth of 3 microns has an aspect ratio of 3. The present invention is particularly beneficial for forming diffusion barrier layers in small high aspect ratio features due to the use of CVD processes for forming conformal platinum diffusion barrier layers over step structures.

As shown in FIG. 2, a stack electrode 187 including a diffusion barrier layer 109 is formed over an adhesion layer 110 that is formed on the bottom surface 185 and the one or more side walls 186 defining opening 184. The barrier, preferably conductive, layer 109 is formed by CVD according to the present invention over the insulative layer 183 and the bottom surface 185. It is desirable that the layer 109 is resistant to oxidation to provide a surface for the deposition of a high dielectric constant material, if desired.

As shown in FIG. 2, the barrier layer 109 is formed preferably over an adhesion layer 110. The adhesion layer is preferably is a conductive material. Suitable materials for forming the adhesion layer include TiN, Ti, W, Rh, Ru, Ir, $RhO_2$, $RuO_2$, $IrO_2$, and a combination thereof. The formation of the adhesion layer can be accomplished by a method as described in copending U.S. Ser. No. 09/146,408, filed Sep. 3, 1998 entitled "Methods for Patterning Platinum and Structures/Methods Using Same,". The layer 109 protects the adhesion layer 110 from strong oxidizing conditions during formation of the high dielectric constant material layer 191. Preferably, the electrode stack layers 109 and 110 are formed over the entire structure including the bottom surface and sidewalls. Then, the layers are formed into lower electrode. For example, the stack layers may be etched or planarized to remove the desired regions for forming the bottom electrode. Thereafter, dielectric layer 191 may then be formed relative to the stack electrode 187. Further thereafter, the second electrode 192 can be formed relative to the dielectric material 191. Preferably, platinum, deposited according to the present invention, is solely used as the bottom electrode 187, or as one of various conductive layers thereof, because it functions not only as an effective electrode material but also as an effective diffusion barrier. With use of the present invention, the bottom electrode formed of a stack of layers including a platinum diffusion barrier layer is conformally formed of uniform thickness using CVD processes as described herein within opening 184.

Following the formation of the layer 109, the dielectric layer 191, and an electrode layer 192 can be provided to form a storage capacitor 189, as shown in FIG. 2. Preferably, for many devices, including those described above, materials suitable for forming high dielectric constant material layers are selected from the group of $TaO_5$, $Ba_xSr_{(1-x)}TiO_3$ [Barium Strontium Titanate or BST], $BaTiO_3$, $SRTiO_3$, $PbTiO_3$, $Pb(Zr,Ti)O_3$ [Lead Zirconium Titanate or PZT], $(Pb,La)(Zr,Ti)O_3$ [PLZT], $(Pb,La)TiO_3$ [PLT], $KNO_3$, $LiNbO_3$, and a combination thereof. Preferably, upper electrode layers, as shown above, are formed with CVD or sputter coating to a thickness of about 20 nm to about 200 nm. Preferably, the electrodes include a conductive material such as those described above or any other conductive material typically used as capacitor electrodes, such conductive materials can be formed in accordance with the present invention.

It will be recognized by one skilled in the art that any capacitor formed relative to a surface, e.g., silicon containing surface, whereupon diffusion barrier properties are required and/or conformally formed conductive layers are required will benefit from the present invention. For example, container capacitors typically include electrodes formed on surfaces requiring conformal formation of a bottom electrode. Such a container capacitor storage cell is described in U.S. Pat. No. 5,270,241 to Dennison, et al., entitled "Optimized Container Stack Capacitor DRAM Cell Utilizing Sacrificial Oxide Deposition and Chemical Mechanical Polishing," issued Dec. 14, 1993.

Figure 3:
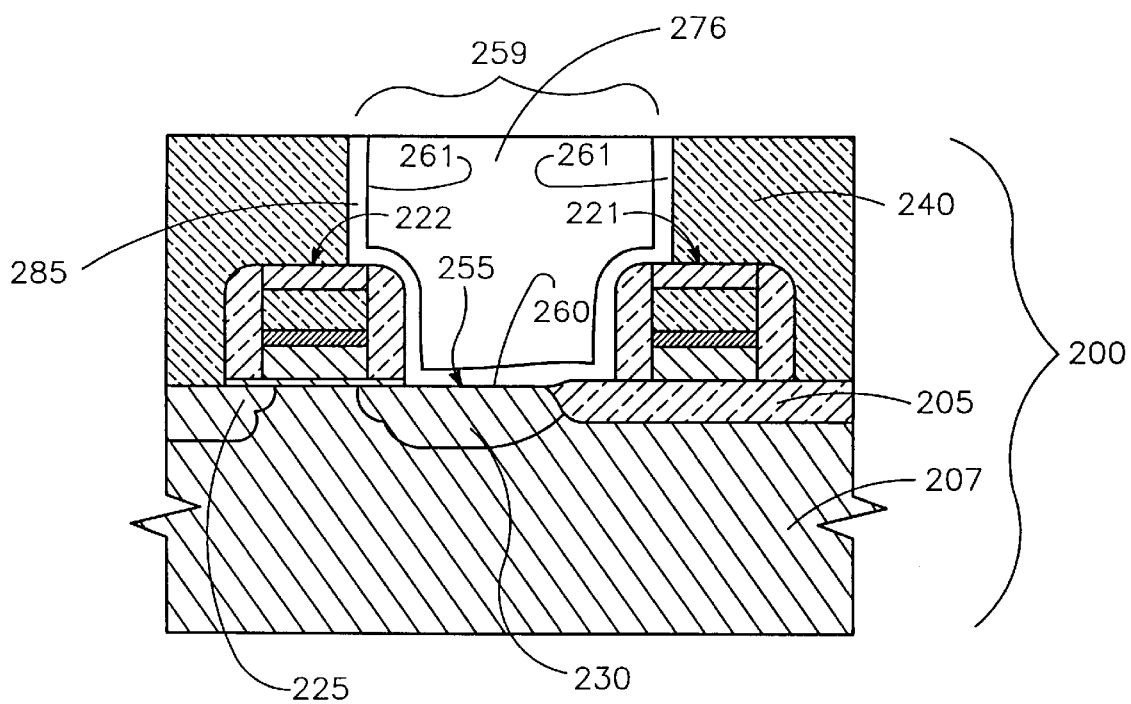
FIG. 3 is a cross-sectional schematic of an embodiment of a layer of a contact formed in accordance with the present invention.

As shown in FIG. 3, device structure 200 is fabricated in accordance with conventional processing techniques through the formation of contact opening 259 prior to metalization of the contact area 255 of substrate 207. As such, prior to metalization, the device structure 200 includes field oxide regions 205 and active areas, i.e., those regions of substrate 207 not covered by field oxide. Formed relative to the field oxide regions 205 in the active areas are word line 221 and FET 222. Suitably doped source/drain regions 225, 230 are formed as known to one skilled in the art. A conformal layer of oxide material 240 is formed thereover and contact opening 259 is defined therein to the contact area 255 of doped region 230 of silicon substrate 207. Thereafter, one or more metalization or conductive layers are formed in the contact opening 259 for providing electrical connection to substrate region 230. Preferably, a barrier layer is formed, according to the present invention, in contact opening 259, shown as layer 285. Preferably, layer 285 is a platinum diffusion barrier layer formed according to the present invention on bottom surface 260 and the one or more side walls 261 defining the opening 259. The platinum diffusion barrier layer is generally deposited over the entire substrate assembly and then planarized to form the contact liner 285. In accordance with the present invention, a conductive material 276, e.g., aluminum, may thereafter be formed in the contact opening for providing connection to doped region 230 of substrate 207.

EXAMPLES

The following examples are offered to further illustrate preferred embodiments and techniques. It should be understood, however, that many variations and modifications may be made while remaining within the scope of the present invention.

In order to evaluated deposition temperature with and without annealing, Examples 1–4 were performed. In each of the Examples, a silicon wafer was placed in a conventional small scale CVD chamber made by Vacuum Products Corp., Hayward, Calif. The organometallic precursor was MeCpPtMe$_3$, and was held in a bubbler at a pressure of 10 torr and a temperature of 33° C. and supplied with a carrier gas of helium at 5 sccm to 50 sccm. An oxidant, oxygen gas, was supplied at 10 SCCM. The CVD reaction chamber pressure was 5 torr. The deposition reaction was carried out for 5 minutes.

If the wafer was subsequently annealed, it was exposed to a conventional rapid thermal oxidation at a temperature of about 850° C. for a period of time of 30 seconds.

The table below summarizes the deposition temperature at the wafer surface and if the wafer was subsequently annealed, for each of the Examples.

TABLE 1

| Example (FIG. #) | Deposition Temp. (° C.) | Annealing? |
|---|---|---|
| 1 (FIG. 4) | 350 | no |
| 2 (FIG. 5) | 350 | yes |
| 3 (FIG. 6) | 200 | no |
| 4 (FIG. 7) | 200 | yes |

Each of the silicon wafers having the platinum layer deposited thereon was analyzed using a PhI 5600 x-ray photo electron spectroscopy (XPS) from Physical Electronics, Eden Prairie, Minn. The depth profiles generated show the composition of the layer deposited as a function of the depth.

Figure 4:
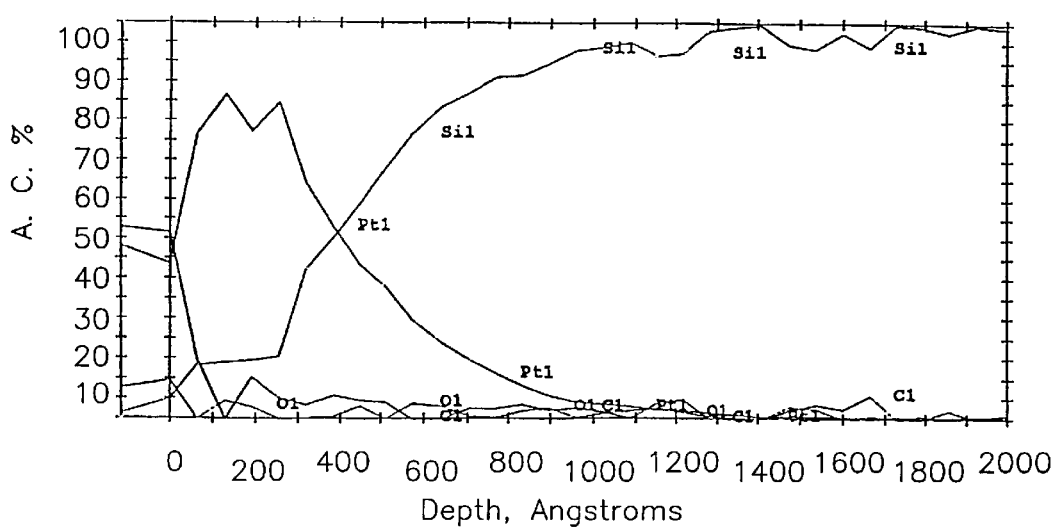
FIG. 4 is a depth profile of a layer formed by CVD at 350° C., without anneal in an oxidizing atmosphere.

FIG. 4 is a depth profile generated for a wafer of Example 1 having a platinum layer deposited at a temperature of 350° C. and was not subsequently annealed. FIG. 4 shows that the platinum layer contains low carbon and low oxygen amounts.

Figure 5:
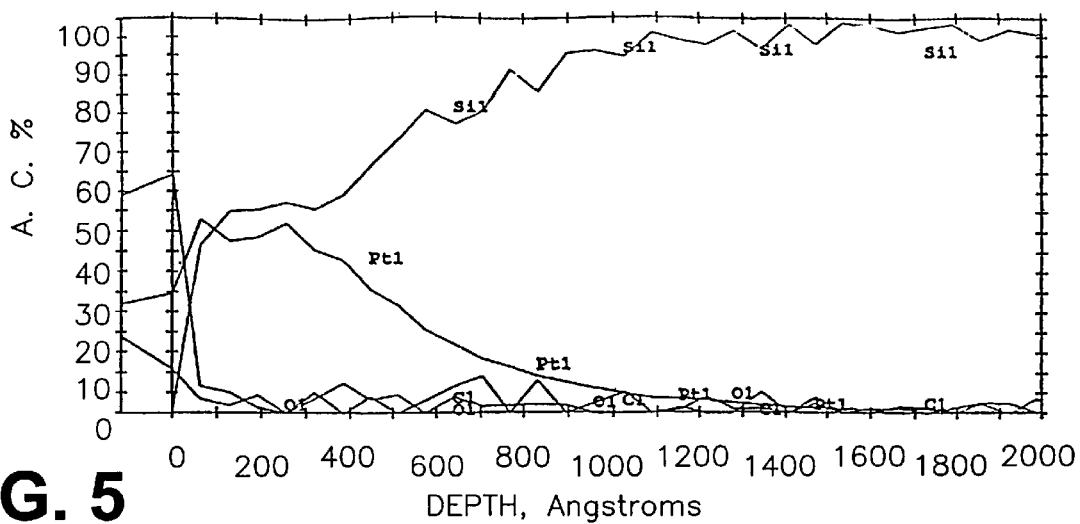
FIG. 5 is a depth profile of the layer of FIG. 4 formed by CVD at 350° C., after being annealed in an oxidizing atmosphere.

FIG. 5 is a depth profile generated for a wafer of Example 2 having a platinum layer deposited at a temperature of 350° C. and was subsequently annealed. FIG. 5 shows that silicon has diffused through the platinum layer and formed SiO$_2$ at the surface. Thus, this platinum layer formed under these deposition conditions exhibited relatively poor barrier characteristics.

Figure 6:
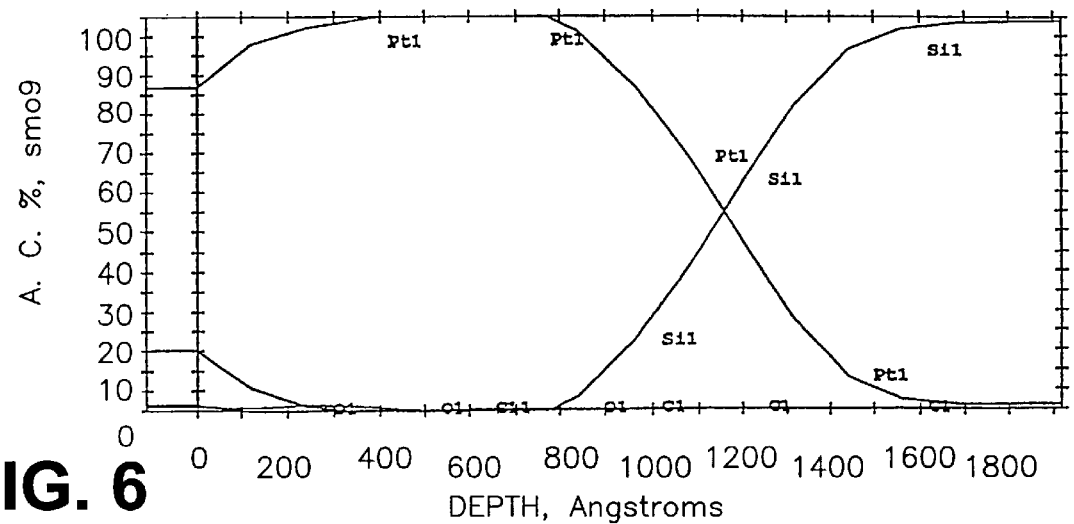
FIG. 6 is a depth profile of a layer formed by CVD at 200° C., without anneal in an oxidizing atmosphere.

FIG. 6 is a depth profile generated for a wafer of Example 3 having a platinum layer deposited at a temperature of 200° C. and was not subsequently annealed.

Figure 7:
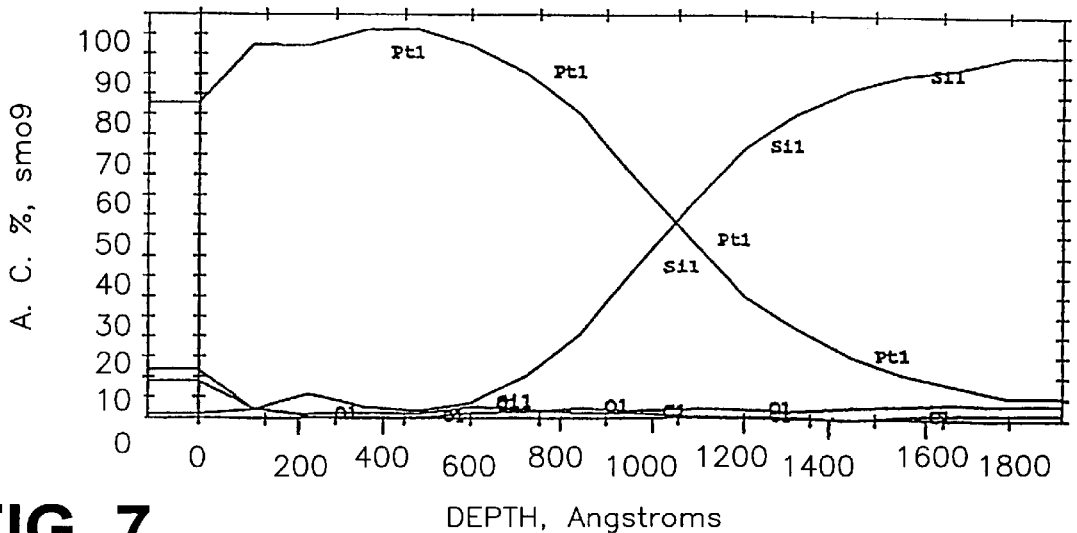
FIG. 7 is a depth profile of the layer of FIG. 6 formed by CVD at 200° C., after being annealed in an oxidizing atmosphere.

FIG. 7 is a depth profile generated for a wafer of Example 4 having a platinum layer deposited at a temperature of 200° C. and was subsequently annealed. FIG. 7 shows that the silicon has not diffused through the platinum layer, demonstrating that the platinum layer formed under these conditions exhibited good barrier characteristics. FIG. 7 also shows no SiO$_2$ at the interface between the platinum layer and the silicon substrate.

Figure 8:
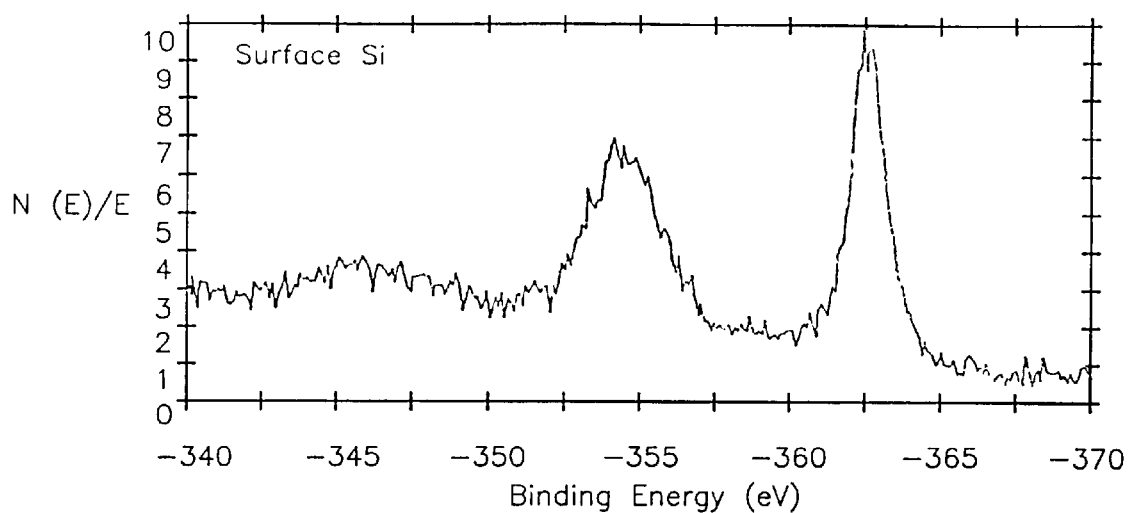
FIG. 8 shows a graphic representation of surface silicon and silicon dioxide on a layer as described with respect to FIG. 5.
Figure 9:
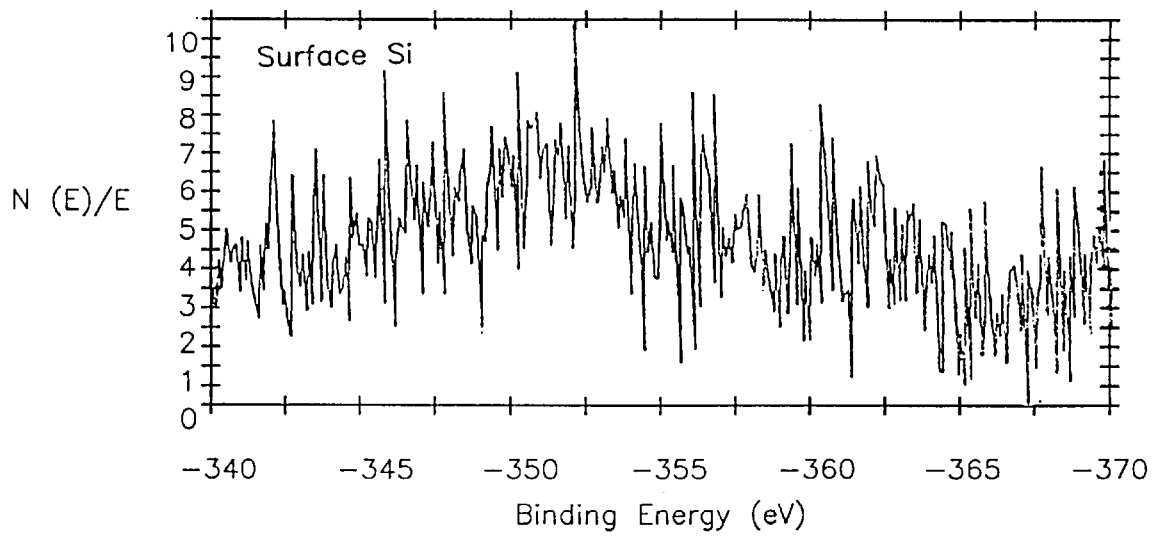
FIG. 9 shows a graphic representation of surface silicon and silicon dioxide on a layer as described with respect to FIG. 7.

FIGS. 8 and 9 show a Si KLL spectra of the surfaces of Examples 2 and 4, respectively. FIG. 8 shows that silicon is present at the surface of the substrate and that Si did diffuse through the platinum layer and was oxidized as evidenced by the presence of SiO$_2$. In contrast, FIG. 9 shows that the silicon levels are below the detection levels of XPS and are considered not to be above background levels.

All patents, patent documents, and publications cited herein are incorporated by reference as if each were individually incorporated by reference. Various modifications and alterations of this invention will be apparent to those skilled in the art without departing from the scope and spirit of this invention, and it should be understood that this invention is not limited to the illustrative embodiments set forth herein.

What is claimed is:

1. A method for use in fabrication of integrated circuits comprising:

providing a substrate assembly having a surface; and forming on at least a portion of the surface of the substrate assembly a barrier layer from an organometallic precursor in the presence of an oxidant at a temperature of about 300° C. or less.

2. The method of claim 1, wherein the surface comprises a material selected from the group of silicon, silicone dioxide, BPSG, PSG, TiN, Ti, W, Rh, Ru, Ir, RhO$_2$, RuO$_2$, IrO$_2$, and a combination thereof.

3. A method for use in formation of a capacitor on a substrate comprising:

providing a surface of a substrate assembly;

forming a first electrode on at least a portion of the surface of the substrate assembly from a platinum-containing organometallic precursor in the presence of an oxidant at a temperature less than about 350° C., wherein the first electrode substantially inhibits permeation of oxygen and silicon therethrough;

forming a high dielectric material over at least a portion of the first electrode; and forming a second electrode on at least a portion of the high dielectric material.

4. A method of forming an electrode of a capacitor comprising:

providing a surface of a substrate assembly; and forming at least one conductive layer on at least a portion of the surface of the substrate assembly, wherein the at least one conductive layer of the electrode is formed from a platinum containing precursor in the presence of an oxidant at a temperature of about 200° C. to about 300° C.

5. A method for forming a conductive barrier layer comprising the steps of:
- providing a substrate including a heated surface in a reactor chamber, wherein the heated surface is about 300° C. or less;
- providing an oxidant within the reactor chamber; and
- supplying a organometallic precursor to the reactor chamber, wherein the organometallic precursor comprises a platinum metallic portion;
- wherein the conductive barrier layer forms on the heated surface.

6. A method for use in fabrication of integrated circuits comprising:
- providing a substrate assembly having a surface; and
- forming on at least a portion of the surface of the substrate assembly a barrier layer from an organometallic precursor in the presence of an oxidant at a temperature of about 300° C. or less, wherein the metal portion of the organometallic precursor is platinum.

7. The method of claim 6, wherein the surface comprises a material selected from the group of silicon, silicone dioxide, BPSG, PSG, TiN, Ti, W, Rh, Ru, Ir, $RhO_2$, $RuO_2$, $IrO_2$, and a combination thereof.

8. The method of claim 6, wherein the organometallic precursor is a platinum containing precursor selected from the group of Me(cyclopentadienyl)Pt(Me)$_3$, Pt(PF$_3$)$_4$, Pt(CO)$_2$Cl$_2$, Pt(CH$_3$)$_2$[(CH$_3$)CN], (1,5 cyclooctadiene)Pt(CH$_3$)$_2$(COD)Pt(CH$_3$)Cl, (C$_5$H$_5$)Pt(CH$_3$)(CO), (acetylacetonate)(Pt)(CH$_3$)$_3$, and a combination thereof.

9. A method for use in fabrication of integrated circuits comprising:
- providing a substrate assembly having a surface; and
- forming on at least a portion of the surface of the substrate assembly a barrier layer from an organometallic precursor in the presence of an oxidant at a temperature of about 300° C. or less, wherein the oxidant is selected from the group consisting of oxygen, ozone, $N_2O$, NO, $SO_3$, $H_2O_2$, $R_2O_2$, and a combination thereof, wherein R is selected from the group consisting of a saturated or unsaturated linear, branched or cyclic hydrocarbon group having about 2 carbon atoms to about 20 carbon atoms.

10. A method for use in fabrication of integrated circuits comprising:
- providing a substrate assembly having a surface; and
- forming on at least a portion of the surface of the substrate assembly a barrier layer from an organometallic precursor in the presence of an oxidant at a temperature of about 100° C. to about 300° C.

11. A method for use in fabrication of integrated circuits comprising:
- providing a substrate assembly having a surface; and
- forming on at least a portion of the surface of the substrate assembly a barrier layer from an organometallic precursor in the presence of an oxidant at a temperature of about 300° C. or less and at a pressure of about 0.1 torr to about 100 torr.

12. A method for use in fabrication of integrated circuits comprising:
- providing a substrate assembly having a surface; and
- forming on at least a portion of the surface of the substrate assembly a barrier layer from an organometallic precursor in the presence of an oxidant at a temperature of about 300° C. or less, wherein the organometallic precursor has a flow rate of about 1 sccm to about 1000 sccm and the oxidant has a flow rate of about 1 sccm to about 5000 sccm.

13. A method for use in formation of a capacitor on a substrate comprising:
- providing a surface of a substrate assembly;
- forming on at least a portion of the surface of the substrate assembly a first electrode on at least a portion of the surface of the substrate assembly from a platinum-containing organometallic precursor in the presence of an oxidant at a temperature less than about 300° C., wherein the first electrode substantially inhibits permeation of oxygen and silicon therethrough;
- forming a high dielectric material over at least a portion of the first electrode; and
- forming a second electrode on at least a portion of the high dielectric material.

14. The method of claim 13, wherein forming a first electrode is at a temperature of about 100° C. to about 300° C.

15. A method for use in formation of a capacitor on a substrate comprising:
- providing a surface of a substrate assembly;
- forming a first electrode on at least a portion of the surface of the substrate assembly from a platinum-containing organometallic precursor in the presence of an oxidant at a temperature less than about 350° C. and at a pressure of about 0.1 torr to about 100 torr, wherein the first electrode substantially inhibits permeation of oxygen and silicon therethrough;
- forming a high dielectric material over at least a portion of the first electrode; and
- forming a second electrode on at least a portion of the high dielectric material.

16. A method for use in formation of a capacitor on a substrate comprising:
- providing a surface of a substrate assembly;
- forming a first electrode on at least a portion of the surface of the substrate assembly from a platinum-containing organometallic precursor at a flow rate of about 1 sccm to about 1000 sccm in the presence of an oxidant a flow rate of about 1 sccm to about 5000 sccm at a temperature less than about 350° C., wherein the first electrode substantially inhibits permeation of oxygen and silicon therethrough;
- forming a high dielectric material over at least a portion of the first electrode; and
- forming a second electrode on at least a portion of the high dielectric material.

17. A method for use in formation of a capacitor on a substrate comprising:
- providing a surface of a substrate assembly;
- forming a first electrode on at least a portion of the surface of the substrate assembly from a platinum-containing organometallic precursor in the presence of an oxidant at a temperature less than about 350° C., wherein the first electrode substantially inhibits permeation of oxygen and silicon therethrough;
- forming a high dielectric material over at least a portion of the first electrode wherein the dielectric material is selected from the group of $TaO_5$, $Ba_xSr_{(1-x)}TiO_3$, $BaTiO_3$, $SRTiO_3$, $PbTiO_3$, $Pb(Zr,Ti)O_3$, $(Pb,La)(Zr,Ti)O_3$, $(Pb,La)TiO_3$, $KNO_3$, $LiNbO_3$, and a combination thereof; and
- forming a second electrode on at least a portion of the high dielectric material.

18. A method for use in formation of a capacitor on a substrate comprising:

provided a surface of a substrate assembly, wherein the surface of the substrate assembly comprises a material selected from the group of silicon, silicone dioxide, BPSG, PSG, TiN, Ti, W, Rh, Ru, Ir, $RhO_2$, $RuO_2$, $IrO_2$, and a combination thereof;

forming a first electrode on at least a portion of the surface of the substrate assembly from a platinum-containing organometallic precursor in the presence of an oxidant at a temperature less than about 350° C., wherein the first electrode substantially inhibits permeation of oxygen and silicon therethrough;

forming a high dielectric material over at least a portion of the first electrode; and forming a second electrode on at least a portion of the high dielectric material.

19. A method for use in formation of a capacitor on a substrate comprising:

providing a surface of a substrate assembly;

forming a first electrode on at least a portion of the surface of the substrate assembly from a platinum-containing organometallic precursor selected from the group of Me(cyclopentadienyl)Pt(Me)$_3$, Pt(PF$_3$)$_4$, Pt(CO)$_2$Cl$_2$, Pt(CH$_3$)$_2$[(CH$_3$)CN], (1,5 cyclooctadiene)Pt(CH$_3$)$_2$, (COD)Pt(CH$_3$)Cl, (C$_5$H$_5$)Pt(CH$_3$)(CO), (acetylacetonate)(Pt)(CH$_3$)$_3$, and a combination thereof, in the presence of an oxidant at a temperature less than about 350° C., wherein the first electrode substantially inhibits permeation of oxygen and silicon therethrough;

forming a high dielectric material over at least a portion of the first electrode; and forming a second electrode on at least a portion of the high dielectric material.

20. The method of claim 19, wherein the oxidant is selected from the group of oxygen, ozone, N$_2$O, NO, SO$_3$, H$_2$O$_2$, R$_2$O$_2$, and a combination thereof, R is selected from the group consisting of a saturated or unsaturated linear, branched or cyclic hydrocarbon group having about 1 carbon atom to about 20 carbon atoms.

21. A method of forming an electrode of a capacitor comprising:

providing a surface of a substrate assembly; and forming at least one conductive layer on at least a portion of the surface of the substrate assembly, wherein the at least one conductive layer of the electrode is formed from a platinum containing precursor in the presence of an oxidant at a temperature of about 200° C. to about 300° C., wherein the oxidant is selected from the group consisting of oxygen, ozone, N$_2$O, NO, SO$_3$, H$_2$O$_2$, R$_2$O$_2$, and a combination thereof, wherein R is selected from the group consisting of a saturated or unsaturated linear, branched or cyclic hydrocarbon group having about 1 carbon atom to about 20 carbon atoms.

22. A method of forming an electrode of a capacitor comprising:

providing a surface of a substrate assembly; and forming at least one conductive layer on at least a portion of the surface of the substrate assembly, wherein the at least one conductive layer of the electrode is formed from a platinum containing precursor in the presence of an oxidant at a temperature of about 200° C. to about 300° C. and at a pressure of about 0.1 torr to about 100 torr.

23. A method of forming an electrode of a capacitor comprising:

providing a surface of a substrate assembly; and forming at least one conductive layer on at least a portion of the surface of the substrate assembly, wherein the at least one conductive layer of the electrode is formed from a platinum containing precursor in the presence of an oxidant at a temperature of about 200° C. to about 300° C., wherein the platinum containing precursor has a flow rate of 1 sccm to about 1000 sccm and the oxidant has a flow rate of about 1 sccm to about 5000 sccm.

24. A method of forming an electrode of a capacitor comprising:

providing a surface of a substrate assembly; and forming at least one conductive layer on at least a portion of the surface of the substrate assembly, wherein the at least one conductive layer of the electrode is formed from a platinum containing precursor in the presence of an oxidant at a temperature of about 200° C. to about 300° C., wherein the platinum containing precursor is selected from the group consisting of Me(cyclopentadienyl)Pt(Me)$_3$, Pt(PF$_3$)$_4$, Pt(CO)$_2$Cl$_2$, Pt(CH$_3$)$_2$[(CH$_3$)CN], (1,5 cyclooctadiene)Pt(CH$_3$)$_2$, (COD)Pt(CH$_3$)Cl, (C$_5$H$_5$)Pt(CH$_3$)(CO), (acetylacetonate)(Pt)(CH$_3$)$_3$, and a combination thereof.

25. A method for forming a conductive barrier layer comprising the steps of:

providing a substrate including a heated surface in a reactor chamber, wherein the heated surface is about 300° C. or less, wherein the surface of the substrate assembly comprises a material selected from the group consisting of silicon, silicone dioxide, BPSG, PSG, TN, Ti, W, Rh, Ru, Ir, RhO$_2$, RuO$_2$, IrO$_2$, and a combination thereof;

providing an oxidant within the reactor chamber; and supplying an organometallic precursor to the reactor chamber, wherein the organometallic precursor comprises a platinum metallic portion;

wherein the conductive barrier layer forms on the heated surface.

26. A method for forming a conductive barrier layer comprising the steps of:

providing a substrate including a heated surface in a reactor chamber, wherein the heated surface is about 300° C. or less;

providing an oxidant within the reactor chamber, wherein the organometallic precursor comprises a platinum metallic portion; and supplying to the reactor chamber an organometallic precursor comprising a platinum metallic portion, the organometallic precursor selected from the group consisting of Me(cyclopentadienyl)Pt(Me)$_3$, Pt(PF$_3$)$_4$, Pt(CO)$_2$Cl$_2$, Pt(CH$_3$)$_2$[(CH$_3$)CN], (1,5 cyclooctadiene)Pt(CH$_3$)$_2$, (COD)Pt(CH$_3$)Cl, (C$_5$H$_5$)Pt(CH$_3$)(CO), (acetylacetonate)(Pt)(CH$_3$)$_3$, and a combination thereof;

wherein the conductive barrier layer forms on the heated surface.

27. A method for forming a conductive barrier layer comprising the steps of:

providing a substrate including a heated surface in a reactor chamber, wherein the heated surface is about 300° C. or less;

providing within the reactor chamber an oxidant selected from the group consisting of oxygen, ozone, $N_2O$, NO, $SO_3$, $H_2O_2$, $R_2O_2$, and a combination thereof, wherein R is selected from the group consisting of a saturated or unsaturated linear, branched or cyclic hydrocarbon group having about 1 carbon atom to about 20 carbon atoms; and supplying an organometallic precursor to the reactor chamber, wherein the organometallic precursor comprises a platinum metallic portion;

wherein the conductive barrier layer forms on the heated surface.

28. A method for forming a conductive barrier layer comprising the steps of:

providing a substrate including a heated surface in a reactor chamber, wherein the heated surface is about 200° C. to about 300° C.;

providing an oxidant within the reactor chamber; and supplying a organometallic precursor to the reactor chamber, wherein the organometallic precursor comprises a platinum metallic portion;

wherein the conductive barrier layer forms on the heated surface.

29. A method for forming a conductive barrier layer comprising the steps of:

providing a substrate including a heated surface in a reactor chamber, wherein the heated surface is about 300° C. or less;

providing an oxidant within the reactor chamber; and supplying an organometallic precursor to the reactor chamber, wherein the organometallic precursor comprises a platinum metallic portion;

wherein the conductive barrier layer forms on the heated surface at a pressure of about 0.1 torr to about 100 torr.

30. A method for fonning a conductive barrier layer comprising the steps of:

providing a substrate including a heated surface in a reactor chamber, wherein the heated surface is about 300° C. or less;

providing within the reactor chamber an oxidant at a flow rate of about 1 sccm to about 5000 sccm; and supplying to the reactor chamber an organometallic precursor at a flow rate of about 1 sccm to about 1000 sccm, wherein the organometallic precursor comprises a platinum metallic portion;

wherein the conductive barrier layer forms on the heated surface.

* * * * *

UNITED STATES PATENT AND TRADEMARK OFFICE
CERTIFICATE OF CORRECTION

PATENT NO.   : 6,204,172 B1                                     Page 1 of 1
DATED        : March 20, 2001
INVENTOR(S)  : Eugene P. Marsh It is certified that error appears in the above-identified patent and that said Letters Patent is hereby corrected as shown below:

Column 1,
Line 39, delete "cerain" and insert therefor -- certain --;

Column 10,
Line 21, after "surface" insert -- 185 --;
Line 21, after "sidewalls" insert -- 186 --;
Line 22, after "electrode" insert -- 187 --;
Line 24, after "electrode" insert -- 187 --;

Column 13,
Line 29, after "(CH$_3$)$_2$" insert -- , --;

Column 16,
Line 35, delete "TN" and insert therefor -- TiN --; and

Column 18,
Line 11, delete "fonning" and insert therefor -- forming --.

Signed and Sealed this

Eighteenth Day of September, 2001

*Attest:*

NICHOLAS P. GODICI
*Attesting Officer*         *Acting Director of the United States Patent and Trademark Office*